United States Patent
Higgins

(10) Patent No.: US 10,161,985 B2
(45) Date of Patent: Dec. 25, 2018

(54) FAULT LOCATION DETECTION SYSTEM AND METHOD

(71) Applicant: Eskom Holdings SOC Limited, Johannesburg (ZA)

(72) Inventor: Simon Higgins, Johannesburg (ZA)

(73) Assignee: Eskom Holdings SOC Limited, Johannesburg (ZA)

( * ) Notice: Subject to any disclaimer, the term of this patent is extended or adjusted under 35 U.S.C. 154(b) by 206 days.

(21) Appl. No.: 14/913,124

(22) PCT Filed: Aug. 18, 2014

(86) PCT No.: PCT/IB2014/063954
§ 371 (c)(1),
(2) Date: Feb. 19, 2016

(87) PCT Pub. No.: WO2015/025260
PCT Pub. Date: Feb. 26, 2015

(65) Prior Publication Data
US 2016/0202307 A1    Jul. 14, 2016

(30) Foreign Application Priority Data
Aug. 20, 2013    (ZA) .................................. 2013/06262

(51) Int. Cl.
*G01R 31/08* (2006.01)
*G01R 31/00* (2006.01)
(Continued)

(52) U.S. Cl.
CPC ........... *G01R 31/08* (2013.01); *G01R 31/001* (2013.01); *G05B 23/0272* (2013.01); *G01R 31/02* (2013.01)

(58) Field of Classification Search
CPC .. G05B 23/0272; G01R 31/001; G01R 31/02; G01R 31/08
See application file for complete search history.

(56) References Cited

U.S. PATENT DOCUMENTS 5,600,248 A    2/1997 Westrom et al.
6,298,308 B1    10/2001 Reid et al.
(Continued)

FOREIGN PATENT DOCUMENTS

WO    WO2010103354 A1 *    9/2010    ............. G01T 29/08

OTHER PUBLICATIONS

International Search Report and Written Opinion, PCT/IB2014/063954, dated Jan. 5, 2015, 10 pages.

*Primary Examiner* — Joseph C Nicely
(74) *Attorney, Agent, or Firm* — Nelson Mullins Riley & Scarborough LLP; Anthony A. Laurentano

(57) ABSTRACT

A fault location detection method includes detecting an EMI signal and analyzing the spectral content of the electrical signal to identify a fault. A location recorder records the location of the system when the EMI signals are detected and a processor analyses the EMI signals and records the location of the system to determine a location of the fault. A memory includes an aerial photograph of a geographic location within which faults are to be detected and wherein the processor overlays the position of the faults on the aerial photograph. In addition, a transparent intensity map is superimposed onto a satellite photo of a geographic location and this is displayed to a user.

12 Claims, 3 Drawing Sheets

(51) Int. Cl.
 *G05B 23/02* (2006.01)
 *G01R 31/02* (2006.01)

(56) References Cited

U.S. PATENT DOCUMENTS

| | | |
|---|---|---|
| 2008/0125984 A1 | 5/2008 | Skendzic et al. |
| 2011/0082653 A1* | 4/2011 | Balcerek ............... G01R 31/088 702/59 |
| 2012/0130665 A1 | 5/2012 | Higgins |
| 2015/0073735 A1* | 3/2015 | Abido ................... G01R 31/088 702/59 |
| 2017/0146613 A1* | 5/2017 | Schweitzer, III ...... G01R 31/40 |

\* cited by examiner

FAULT LOCATION DETECTION SYSTEM AND METHOD

RELATED APPLICATIONS

This application is a 35 U.S.C. 371 national stage filing of International Application PCT/IB2014/063954, filed Aug. 18, 2014, which claims priority to South Africa Patent Application No. 2013/06262 filed on Aug. 20, 2013 in South Africa. The contents of the aforementioned applications are hereby incorporated by reference.

BACKGROUND OF THE INVENTION

Electricity high voltage substations contain equipment such as current transformers, voltage transformers, breakers and so on. Anomalies within high voltage equipment's insulation can produce Electromagnetic Interference (EMI) within the substation.

The present invention seeks to analyse the EMI present in a substation to determine the location of potentially defective pieces of equipment and to output a transparent intensity map superimposed onto an aerial photo of a substation showing locations of faults.

SUMMARY OF THE INVENTION

According to one example embodiment, a fault location detection system comprises:
  an EMI detection module that detects an EMI signal and converts this into an electrical signal;
  an analyzing module for analyzing the spectral content of the electrical signal to identify a fault;
  a location recorder to record the location of the system when the EMI signals are detected;
  a memory for data storage; and
  a processor for using the analyzed EMI signals and recorded location of the system to determine a location of the fault.

The processor may determine the GPS co-ordinates of the faults.

The memory preferably includes an aerial photograph of a geographic location within which faults are to be detected, and the processor overlays the positions of the faults on the aerial photograph.

The processer may then convert the Cartesian or pixel co-ordinates of the faults on the aerial photograph into the GPS co-ordinates of the faults.

In one example, the processor determines the GPS location of the fault.

According to another example embodiment, a fault location detection method includes:
  detecting an EMI signal and converting this into an electrical signal;
  analyzing the spectral content of the electrical signal to identify a fault;
  recording the location of the system when the EMI signals are detected; and
  using the analyzed EMI signals and recorded location of the system to determine a location of the fault.

DESCRIPTIONS OF PREFERRED EMBODIMENTS

Figure 1:
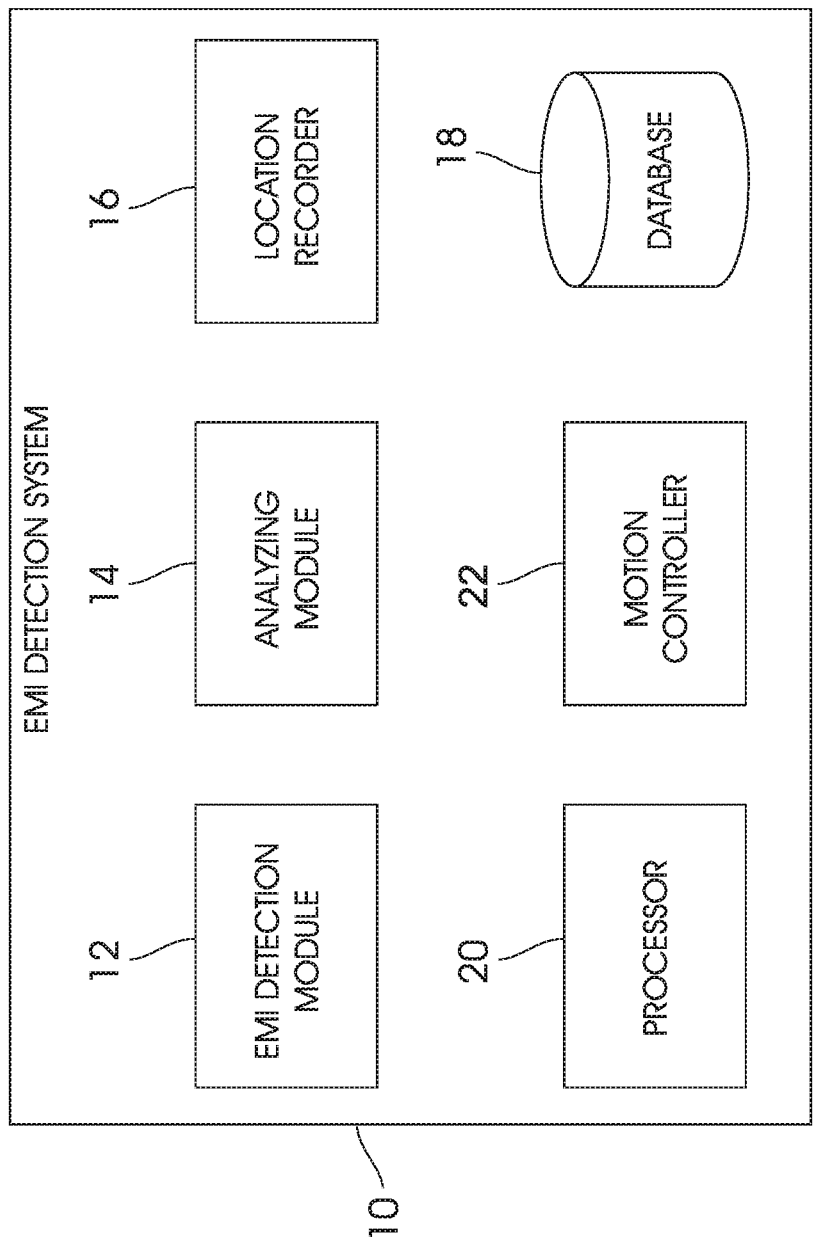
FIG. 1 shows a block diagram of an example embodiment of a measurement system.
Figure 2:
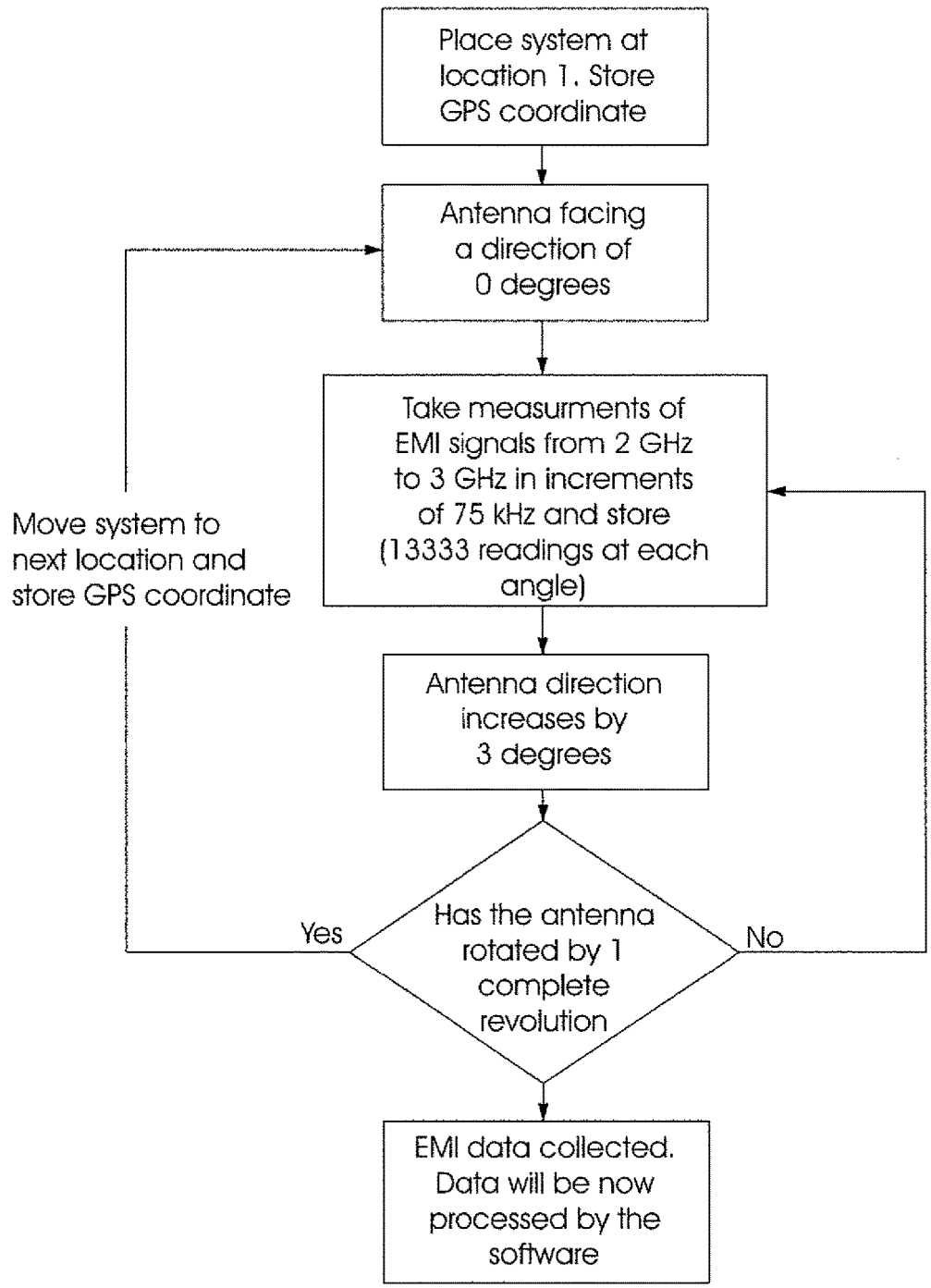
FIG. 2 shows a flow diagram of the operation of the system of FIG. 1.

Referring to the accompanying Figures, an electromagnetic interference detection system 10 for locating potentially defective equipment in high voltage electrical substations is described.

An Electromagnetic Interference (EMI) detection module 12 detects EMI signals and converts these into an electrical signal.

In the illustrated embodiment the EMI detection module 12 detects EMI signals and measures the power in suitable units, such as dBm. In an example described below, the EMI samples detected were in the 0 to 5 GHz frequency range. It will be appreciated that other suitable frequency ranges could be used.

Any electrical device that can detect EMI and convert it into an electrical signal designed to acquire EMI signals can be used.

In one example embodiment the EMI detection module 12 includes an RF antenna to detect EMI and convert it into an electrical signal.

The electrical signal is transferred to an analyzing module 14 which is used for analyzing the spectral content of the electrical signal. If there is no separate analyzing module 14 or if the analyzing module 14 is contained in the processor 20, this will be achieved by the processor 20.

In one example embodiment the analyzing module is a spectrum analyzer that is used to examine the spectral content of an electrical signal. If a spectrum analyzer is used to take measurements of the EMI signals present then the antenna is connected to the RF input of the spectrum analyzer. The spectrum analyzer used in an example embodiment was the Rohde and Schwarz FSP 7.

The analyzing module 14 will typically interpret the signals and separate individual EMI sources from background noise. The analyzing module 14 establishes the type and strength of emissions from typical sources. Sources of interference are also identified and isolated.

A location recorder 16 is used to record the location of the device when the EMI signals are detected.

In the illustrated embodiment, the location recorder 16 is a Global Positioning System (GPS) device.

In use, the system is placed in a few locations in a substation, one location at a time and the GPS coordinates of each location are captured. At each location the system measures EMI signals or gathers EMI data. This will be described in more detail below. However, it must be appreciated that multiple devices may be used simultaneously in order to achieve a similar result.

A storage device in the form of memory 18 is used for data storage. All EMI data is stored in a data structure. An example of this is a one dimensional array where each element of the array is another multi-dimensional array made up of a few thousand rows and number of columns that equal the number of angles of interest. The rows and columns correspond to the power and angle values mentioned above.

In one example embodiment, at least an antenna, high precision motor including a rotator and motion controller 22 are included in a movable housing that can be moved from position to position in any area in which EMI measurements will be taken. This will typically be in a location including equipment, such as a high voltage electrical substation.

At each of the positions a plurality of EMI measurements are taken before the movable unit is moved to the next position.

A rotator coupled to the motion controller 22 is used to rotate the antenna. The motion controller has to control a high precision motor to achieve very precise positions. This high precision motor ensures that the antenna is positioned almost exactly at the necessary angles. The motor rotates the antenna by a certain increment, measurements are then taking by the device that measures the spectral content of a signal and stored in a storage unit or memory device. The motor then rotates the antenna to the next angle of interest and once again measurements are taken. This continues for a complete revolution.

It will be appreciated that the fewer number of degrees used in each increment, the higher the accuracy of the system. If a 3° increment is used then for a complete revolution there are 120 angles of interest. It will also be appreciated that through a non-mechanical rotation of the antenna or with an antenna array or directive system, for example a reflector, it will possible to achieve similar results.

A DC motor coupled to a motion controller can be used to rotate the RF antenna as required. In this example the motion controller is incorporated into the processor 20.

In use, at each measurement location in the substation, the RF antenna is rotated by a rotator system in steps of 3°, for example, for a complete revolution.

To start, the antenna first faces a direction of 0° and the device that examines the spectral content of an electrical signal takes measurements of EMI signals, for example from 0 GHz to 5 GHz, in steps of between 0 kHz and 1 GHz, for example. Therefore a few thousand readings are obtained at 0°.

In the illustrated embodiment, all the modules are incorporated into a single modular and movable system. However, it will be appreciated that some of the modules illustrated in FIG. 1 may be remote from the antenna and detector system described above. In this type of scenario the EMI signals detected will be transmitted to a remote analysing module 14 for further processing.

It will also be appreciated that the modules described may be implemented by a machine-readable medium embodying instructions which, when executed by a machine, cause the machine to perform any of the methods described.

In another example embodiment the modules may be implemented using firmware programmed specifically to execute the method described herein.

It will be appreciated that embodiments of the present invention are not limited to such architecture, and could equally well find application in a distributed, or peer-to-peer, architecture system. Thus the modules illustrated could be located on one or more servers operated by one or more institutions.

It will also be appreciated that in any of these cases the modules may form a physical apparatus with physical modules specifically for executing the steps of the method described herein.

In any event, the measured data is stored in the memory device 18 and used by the analyzing module 14.

The analyzing module 14 nulls any frequency bias by removing the linear dependence of the data across frequency. A function that removes the best straight line fit linear trend from the data is applied to the power readings. The signal is centred on its mean and straightened to remove any over frequency bias as follows: Amplitude (dBm)=de-trend(Amplitude(dBm)+mean(Amplitude(dBm))).

Interference signals are present in the band as may be shown by a vertical signal pattern at a specific frequency band. This interference is nulled.

The number of points that exceed the mean by certain thresholds in units of decibels is counted. These are added and divided by the total number of points to give an intensity value. Simply put, an intensity value for each direction is obtained by counting the spikes that exceed a threshold. The thresholds for example are 3 dB or 10 dB above the mean signal level. An intensity pattern is obtained for every location. The directional patterns may exhibit sharp minima in the main beam. Averaging is performed over every 3 adjacent rotations to produce smoother patterns.

Figure 3:
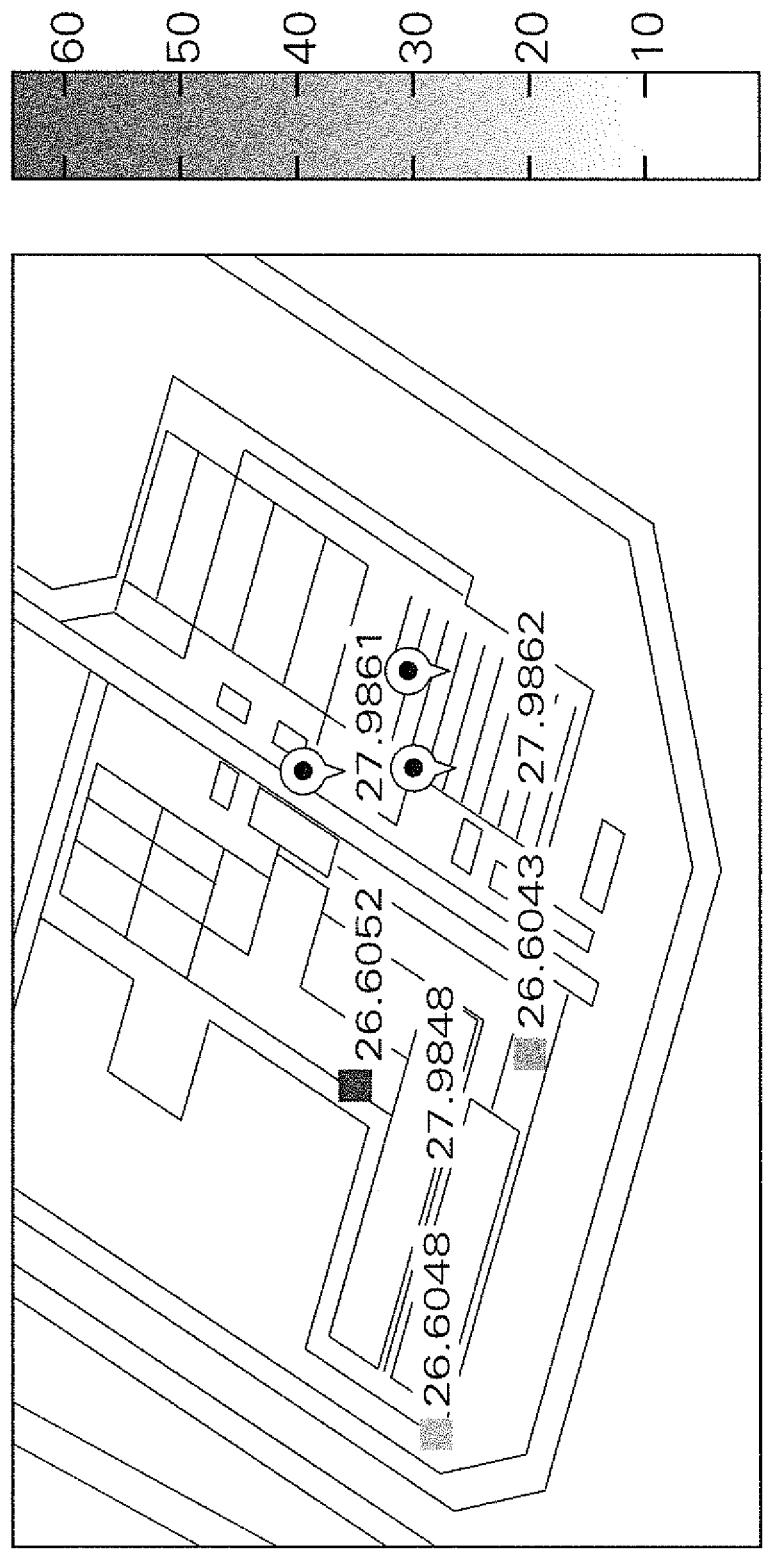
FIG. 3 show specific faults identified and isolated on a photo with the GPS coordinates calculated.

The measurement locations are also plotted or displayed on an aerial photo (FIG. 3). After all the measurements at a particular location, the system is then moved to a few other positions and the same process is repeated at each position. The GPS coordinate of each position is also captured.

Once all the data has been acquired, a processor 20 is used for establishing the direction from which EMI signals received were produced and signal processing software executing on the processor is used to triangulate the locations of potentially defective equipment or hotspots. The system also produces the GPS coordinates—latitude and longitude of potentially defective equipment as will be described below.

The processor 20 in one example is a programmable controller that is used to control the system and process the measurement data.

The GPS coordinates of the faults are determined as follows, however, it must be appreciated that there are various methods and algorithms that will achieve the same or similar results.

Firstly there are two coordinate systems, GPS, and Cartesian (pixel).

There is a pre-selected aerial photograph for each substation which has a set resolution and size resulting in a pixel or Cartesian coordinate system on that particular photograph which is known. This photograph can be obtained from any source or digital mapping tool, for example Google Maps. The photograph can be scaled adequately as required using any processing technology, or tool, or the processor 20.

GPS reference points are taken initially to link the pixel coordinate system to the GPS coordinate system. Thereafter, the information collected using the direction, GPS, and EMI data described above is processed to generate an intensity map which is sized based on the pixel coordinates and size of the satellite photograph. The intensity map uses different colours to denote different severities of sources as will be explained in more detail below.

The processor 20 superimposes the intensity map onto the photograph to generate a "photo-intensity" map. In the process, all GPS coordinates are converted to Cartesian coordinates.

This "photo-intensity" map is then processed to identify the points of maximum intensity around a particular source of EMI and zero all other points. Once those points are identified, they are shown as squares on the photograph, and their Cartesian or pixel coordinates are converted back into GPS coordinates.

In other words, it is through the superimposition of the intensity map on the satellite photograph that the locations of the faulty equipment can be identified. The intensity map is based on direction and intensity (described below), whilst the photograph is based on pixel coordinates. By combining these it is possible to calculate GPS coordinates from the pixel coordinates.

Referring to the shaped markers in FIG. 3, the three round shaped markers on the right of the image are reference points needed to find the GPS coordinates of the faults. The GPS coordinates of these locations in the substation are known and these are used to link the pixel coordinate system to the GPS coordinate system.

It is possible to calculate GPS co-ordinates using only two points using the third point as a reference to verify the algorithm. The squares are the sources of EMI. These display corresponding GPS coordinates of the fault locations.

Different colours may be used to denote different severities of sources, e.g. red can denote a larger or more serious source and yellow a less serious source.

It must be appreciated that the reference points and fault locations can be displayed in any shape, size, or colour. There is also capability of displaying a lower resolution fault description, for example, the complete "photo-intensity" map. Power and frequency spectrum information which is used by the processor 20 is also available for display.

The locations of these sources can be found by using a GPS receiver or GPS coordinate calculators such as Google Maps.

The pixel coordinates of any point in the image in FIG. 3 can also be found using a numerical computing tool. Using the known GPS coordinates of the reference points and the known pixel coordinates of the shaped markers, the change in pixel coordinates can be used to find the change in GPS coordinates.

GPS coordinate of location 1 is identified by the upper marker and is known.

GPS coordinate of location 2 is identified by the marker on the right and is known.

GPS difference=GPS coordinate of location 2−GPS coordinate of location 1.

Alternatively, using the pixel data on a map:

Pixel coordinate of location 1 is identified by the upper marker and is known.

Pixel coordinate of location 2 is identified by the marker on the right and is known.

Pixel difference=Pixel coordinate of location 2−Pixel coordinate of location 1.

The pixel location of the fault can now be calculated.

Change in pixel value=Pixel location of fault−Pixel coordinate of location 1.

Change in GPS value=(Change in pixel value×GPS difference)÷Pixel difference

GPS coordinate of the fault=GPS coordinate of location 1+Change in GPS value.

It will be appreciated that there are other methods of cross referencing these coordinates which achieve the same or similar results.

The EMI data, more specifically the power-frequency-angle data, is put through a direction finding algorithm using the various GPS coordinates captured whilst measurements were taken. The direction information from the single mobile system's various location measurements are combined to locate the EMI source via triangulation. This establishes the direction from which the received signals were transmitted.

The substation is divided up into a grid where each element is of a certain area. All elements have the same area. A quantity is assigned to every point which is proportional to the estimated power radiated from it. The contribution of every measurement location at a point is added after first normalizing the pattern at every measurement location with respect to its maximum i.e. the maximum amount of peaks counted in a direction at a particular location. The resulting patterns are then added to produce an intensity map or source locating grid.

The intensity map is then made transparent and superimposed onto a satellite photo of the substation as described above.

Once the source locating grid has been made transparent and superimposed onto the satellite photo of the substation, the area that encompasses defective equipment might still be large with many pieces of equipment located within the area. Identifying the source of emission will still be difficult. Within each area or boundary there is at least one point/ location with the highest power radiated. It is most probable that this specific location is the source of emission. So if all other points within these large regions are zeroed leaving only this maximum point, it is much easier to find the faulty equipment due to the much higher resolution. A square can be overlaid on top of this point to produce high resolution fault finding.

The output of the system is a transparent intensity map superimposed onto a satellite photo of a substation.

All that remains is for substation maintenance personnel to utilize a GPS receiver to journey to the specified coordinate.

In one example embodiment, in order to plot the intensity map onto the satellite photo of the substation taking into account scaling, different coordinate systems, substation geographic locations and so on, the following can be done.

The GPS coordinates of each measurement location are captured when measurements are taken. These need to be in a decimal GPS format. These are converted to Cartesian coordinates in order to be plotted on a satellite photo of the substation.

The circumference of the earth is 40 041 000 meters.

The lowest valued decimal GPS coordinate of all the measurement locations is found. i.e. locMin_latitude and locMin_longitude The highest valued decimal GPS coordinate of all the measurement locations is found. i.e. locMax_latitude and locMax_longitude The decimal GPS coordinate of the left most position of the substation is found. i.e. borderMin_latitude and borderMin_longitude The decimal GPS coordinate of the right most position of the substation is found. i.e. borderMax_latitude and borderMax_longitude This is converted to a Cartesian coordinate as follows borderMax_Cartesian_y=borderMax_latitude−borderMin_latitude×40 041 000/360.

borderMax_Cartesian_x=borderMax_longitude−borderMin_longitude×40 041 000/360×cos(borderMax_latitude)

The cosine function in the above equation must operate on a degree representation of borderMax_latitude.

The relative coordinate values of all decimal GPS coordinates of all measurement locations are found as follows coordRel_latitude=Latitude GPS coordinate of measurement location−borderMin_latitude coordRel_longitude=longitude GPS coordinate of measurement location−borderMin_longitude The Cartesian coordinates of all measurement locations are found as follows coordCar_y=coordsRel_latitude×40 041 000/360 coordCar_x=coordsRel_longitude×40 041 000/360×cos (Latitude GPS coordinate of measurement location)

A step size is defined i.e. step=0.8

The Cartesian coordinates are rounded off to the nearest step using a rounding of function
coordCar_y=round (coordCar_y/step)×step
coordCar_x=round(coordCar_x)×step
borderMax_Cartesian_y=round(borderMax_Cartesian_y/step)×step
borderMax_Cartesian_y=round(borderMax_Cartesian_x/step)×step A function that transforms the domain specified by the above into arrays that can be used for the evaluation of functions of two variable and 3-d plots is applied.
envGridX and envGridY=meshgrid(0:step:borderMax_Catesian_x,
0:steps:borderMaxCar_y)

A reference angle position is defined
angleRef=65.41842551743129
The following equations are used to process the grid.
angleRefCorrect=[0 0 0 0 0 0 0 0 0 0 0 0 0]
rWeight=0
For each measurement location
thetaGrid{location}=Four Quadrant Inverse Tan Function (envGridY-coordsCar(location,2),envGridX-coordsCar(location,1))/pi*180+angleRef % angle between environment grid and measurement ref
thetaGrid{location}(thetaGrid{location}<0)=thetaGrid{location}(thetaGrid{location}<0)+360;
thetaGridIndex{location}=round(thetaGrid{location}/3+1);
thetaGridindex{location}(thetaGridindex{location}>length(angle))=thetaGridIndex{location}thetaGridIndex{location}length(angle))−length(angle);
rGrid{location}=sqrt((envGridX-coordsCar(location,1)).^2+(envGridY-coordsCar(location,2)).^2);
for k=1:size(rGrid{locations(1)},2)
rProx{location}(:,k)=rGrid{location}(:,k)<200;
rZero{location}(:,k)=250^10./(250^10+(rGrid{location}(:,k)).^10);
rWeight=rWeight+rZero{location};
end
rWeight=rWeight/length(locations)+1;
For each location
[cartPatPeakX{location}cartPatPeakY{location}]=pol2cart((angle-angleRef-angleRefCorrect(location))/180*pi,patternPeak{location});
[cartPatPeakXNorm{location}cartPatPeakYNorm{location}]=pol2cart((angle-angleRef-angleRefCorrect(location))/180*pi,patternPeakNorm{location});
To locate the source of emission the following is used.
sourceEstimate3=zeros(size(thetaGridIndex{handles.locations(1)}))
sourceEstimate3=sourceEstimate3+patternPeakNorm{location}(thetaGridIndex{location});
sourceEstimate3=sourceEstimate3/max(max(sourceEstimate3));

The invention claimed is:

1. A fault location detection system comprises:
an Electromagnetic Interference (EMI) detection module including an RF antenna that detects EMI signals and converts the EMI signals into electrical signals;
a memory for data storage;
a motor for rotating the antenna wherein the motor rotates the antenna and EMI measurements are taken by the EMI detection module and converted to electrical signals, the motor then rotates the antenna to a next angle of interest and once again measurements are taken by the EMI detection module and converted to electrical signals, wherein the measurements are repeated for a plurality of different angles of interest;
an analyzing module for analyzing a spectral content of the electrical signals to identify a fault;
a movable housing in which the EMI detection module, the antenna, the memory and the motor are housed and which is moved from position to position in an area in which EMI measurements are taken;
a location recorder to record a location of the housing when the EMI signals are detected; and
a processor for using the analyzed signals and recorded location of the housing to determine a location of the fault.

2. A system according to claim 1 wherein the processor determines the GPS co-ordinates of the fault.

3. A system according to claim 1 wherein the memory includes an aerial photograph of a geographic location within which faults are to be detected and wherein the processor overlays the position of the fault on the aerial photograph.

4. A system according to claim 3 wherein the processer converts the Cartesian or pixel co-ordinates of the fault on the aerial photograph into the GPS co-ordinates of the fault.

5. A system according to claim 4 wherein the processor produces a transparent intensity map superimposed onto a satellite photo of a geographic location.

6. A system according to claim 5 further including a display via which the transparent intensity map superimposed onto a satellite photo of a geographic location is output to a user.

7. A fault location detection method, comprising:
using an antenna and an Electromagnetic Interference (EMI) detection module to measure an EMI signal;
moving with a motor the antenna and EMI detection module from position to position in an area in which EMI measurements are taken;
taking a plurality of measurements at each position with the EMI detection module, wherein this procedure is repeated for a plurality of different angles of interest;
converting the EMI signals into electrical signals;
analyzing a spectral content of the electrical signals to identify a fault;
recording a location of the antenna and EMI detection module when the EMI signals are measured; and
using the analyzed EMI signals and recorded location of the antenna and EMI detection module to determine a location of the fault.

8. A method according to claim 7 wherein GPS co-ordinates of the fault are determined.

9. A method according to claim 7 wherein a memory includes an aerial photograph of a geographic location within which faults are to be detected and wherein the method includes overlaying the position of the fault on the aerial photograph.

10. A method according to claim 9 wherein the Cartesian or pixel co-ordinates of the fault are converted on the aerial photograph into the GPS co-ordinates of the fault.

11. A method according to claim 10 wherein a transparent intensity map superimposed onto a satellite photo of a geographic location is produced.

12. A method according to claim 11 further including outputting to a user a display of the transparent intensity map superimposed onto a satellite photo of a geographic location is output to a user.

* * * * *